(12) United States Patent
Won et al.

(10) Patent No.: US 9,318,169 B2
(45) Date of Patent: Apr. 19, 2016

(54) BIT LINE EQUALIZING CIRCUIT

(71) Applicant: Samsung Electronics Co., Ltd., Suwon-si (KR)

(72) Inventors: Bok-Yeon Won, Namyangju-si (KR); Hyuk-Joon Kwon, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/326,543

(22) Filed: Jul. 9, 2014

(65) Prior Publication Data

US 2015/0016199 A1    Jan. 15, 2015

(30) Foreign Application Priority Data

Jul. 9, 2013  (KR) .......................... 10-2013-0080362

(51) Int. Cl.
| | |
|---|---|
| *G11C 7/00* | (2006.01) |
| *G11C 7/12* | (2006.01) |
| *G11C 11/4094* | (2006.01) |
| *H01L 27/02* | (2006.01) |
| *H01L 27/108* | (2006.01) |

(52) U.S. Cl.
CPC .............. *G11C 7/12* (2013.01); *G11C 11/4094* (2013.01); *H01L 27/0207* (2013.01); *H01L 27/10897* (2013.01)

(58) Field of Classification Search
CPC ... G11C 7/12; G11C 11/4093; G11C 2207/12
USPC .......................................... 365/202, 203, 205
See application file for complete search history.

(56) References Cited

U.S. PATENT DOCUMENTS

| | | | |
|---|---|---|---|
| 6,046,950 | A | 4/2000 | Kim |
| 6,094,390 | A | 7/2000 | Inaba et al. |
| 6,552,357 | B2 | 4/2003 | Akita |
| 6,765,833 | B2 | 7/2004 | Khang |
| 6,838,337 | B2 | 1/2005 | Schreck |
| 7,474,549 | B2 | 1/2009 | Chang et al. |
| 7,898,886 | B2 | 3/2011 | Kwon et al. |
| 2008/0080282 | A1* | 4/2008 | Chang ........................... 365/205 |
| 2008/0298111 | A1* | 12/2008 | Ahn et al. ........................ 365/51 |
| 2012/0154046 | A1* | 6/2012 | Chun ..................... G11C 7/065 330/253 |

FOREIGN PATENT DOCUMENTS

| | | | |
|---|---|---|---|
| KR | 10-0379550 A | 4/2003 | |
| KR | 10-0482994 B1 | 4/2005 | |
| KR | 10-0522902 B1 | 4/2006 | |

* cited by examiner

*Primary Examiner* — Han Yang
(74) *Attorney, Agent, or Firm* — Sughrue Mion, PLLC

(57) ABSTRACT

There is provided a bit line equalizing circuit including: an active region; a first bit line disposed on the active region in a first direction; a second bit line disposed on the active region in the first direction; a gate pattern including a first pattern disposed on the active region in a second direction crossing the first direction, and a second pattern extended from one side of the first pattern to be disposed in the first direction, and formed in a stair shape; a first contact disposed at one side of the first pattern and one side of the second pattern, and configured to connect the active region and the first bit line; a second contact disposed at one side of the first pattern and the other side of the second pattern, and configured to connect the active region and the second bit line; and a third contact disposed at the other side of the first pattern, and configured to provide a predetermined voltage to the active region.

20 Claims, 8 Drawing Sheets

BIT LINE EQUALIZING CIRCUIT

CROSS-REFERENCE TO RELATED APPLICATION

This application claims priority from Korean Patent Application No. 10-2013-0080362 filed on Jul. 9, 2013 in the Korean Intellectual Property Office, the contents of which are incorporated herein in its entirely by reference.

BACKGROUND

1. Field

Apparatuses consistent with exemplary embodiments relate to a bit line equalizing circuit.

2. Description of the Related Art

A sense amplifier circuit is a circuit connected to a memory cell array to detect and amplify data of a selected memory cell in the memory cell array.

The sense amplifier circuit is connected to a pair of bit lines to detect data of the memory cell. The sense amplifier circuit includes an equalizing circuit equalizing voltage of the pair of bit lines before and after a data detection operation.

SUMMARY

One or more exemplary embodiments provide a bit line equalizing circuit including one equalizing transistor and a plurality of pre-charged transistors in a small occupying area.

One or more exemplary embodiments also provide various equalizing circuit arrays, each including a plurality of equalizing circuits, and a sense amplifier circuit including an equalizing circuit array.

According to an aspect of an exemplary embodiment, there is provided a bit line equalizing circuit including: an active region; a first bit line disposed on the active region in a first direction; a second bit line disposed on the active region in the first direction; a gate pattern including a first pattern disposed on the active region in a second direction crossing the first direction, and a second pattern extended from one side of the first pattern to be disposed in the first direction, and formed in a stair shape; a first contact disposed at one side of the first pattern and one side of the second pattern, and configured to connect the active region and the first bit line; a second contact disposed at one side of the first pattern and the other side of the second pattern, and configured to connect the active region and the second bit line; and a third contact disposed at the other side of the first pattern, and configured to provide a predetermined voltage to the active region.

According to an aspect of another exemplary embodiment, there is provided a bit line equalizing circuit including: an active region traversed by a first bit line and a second bit line; a plurality of transistors serially connected between the first bit line and the second bit line, and configured to supply a predetermined voltage to the first bit line and the second bit line; and an equalizing transistor connected between the first bit line and the second bit line, and configured to equalize a voltage of the first bit line and a voltage of the second bit line, wherein the plurality of transistors and the equalizing transistor share a gate pattern, the gate pattern includes a first pattern disposed on the active region in a first direction, and a second pattern extended from one side of the first pattern to be disposed in a second direction crossing the first direction, and the second pattern is bent at a first position in the first direction, and bent at a second position different from the first position in the second direction to be extended.

According to an aspect of still another exemplary embodiment, there is provided a bit line equalizing circuit including an equalizing transistor which is connected to a first bit line and a second bit line, and configured to be turned on if an equalizing signal is input; and a plurality of transistors which are connected to one another, configured to be turned on and provide a predetermined voltage to the first and second bit lines, if the equalizing signal is input, wherein the first and second bit lines are equalized to have a same voltage by the predetermined voltage.

BRIEF DESCRIPTION OF THE DRAWINGS

The above and other aspects of the inventive concept become more apparent by describing in detail exemplary embodiments thereof with reference to the attached drawings, in which.

DETAILED DESCRIPTION OF THE EMBODIMENTS

Figure 1:
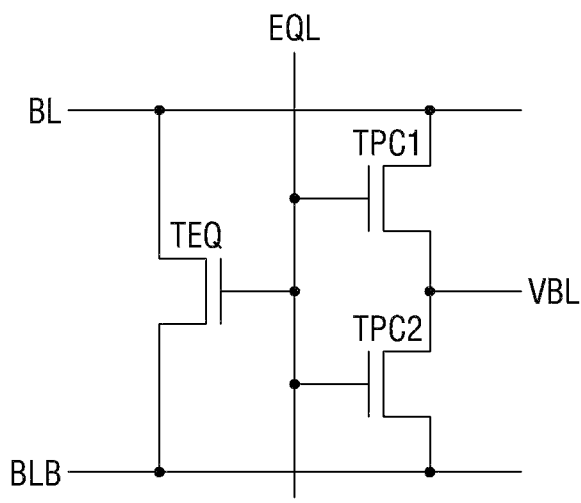
FIG. 1 is a circuit diagram for describing an equalizing circuit according to an exemplary embodiment.

The inventive concept will now be described more fully hereinafter with reference to the accompanying drawings, in which exemplary embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same or like reference numbers may indicate the same or like components throughout the specification.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

The inventive concept will be described with reference to perspective views, cross-sectional views, and/or plan views, in which exemplary embodiments are shown. Thus, the profile of an exemplary view may be modified according to manufacturing techniques and/or allowances. That is, the embodiments are not intended to limit the scope of the inventive concept but cover all changes and modifications that can be caused due to a change in manufacturing process. Thus, regions shown in the drawings are illustrated in schematic form and the shapes of the regions are presented simply by way of illustration and not as a limitation. Features, elements, components, integers, steps, processes, functions, characteristics, and the like, described in conjunction with a particular aspect, embodiment, example or claim of the inventive concept are to be understood to be applicable to any other aspect, embodiment, example or claim described herein unless incompatible therewith FIG. 1 is a circuit diagram for describing an equalizing circuit according to an exemplary embodiment, and FIG. 2 is a layout diagram for describing the equalizing circuit of FIG. 1.

Figure 2:
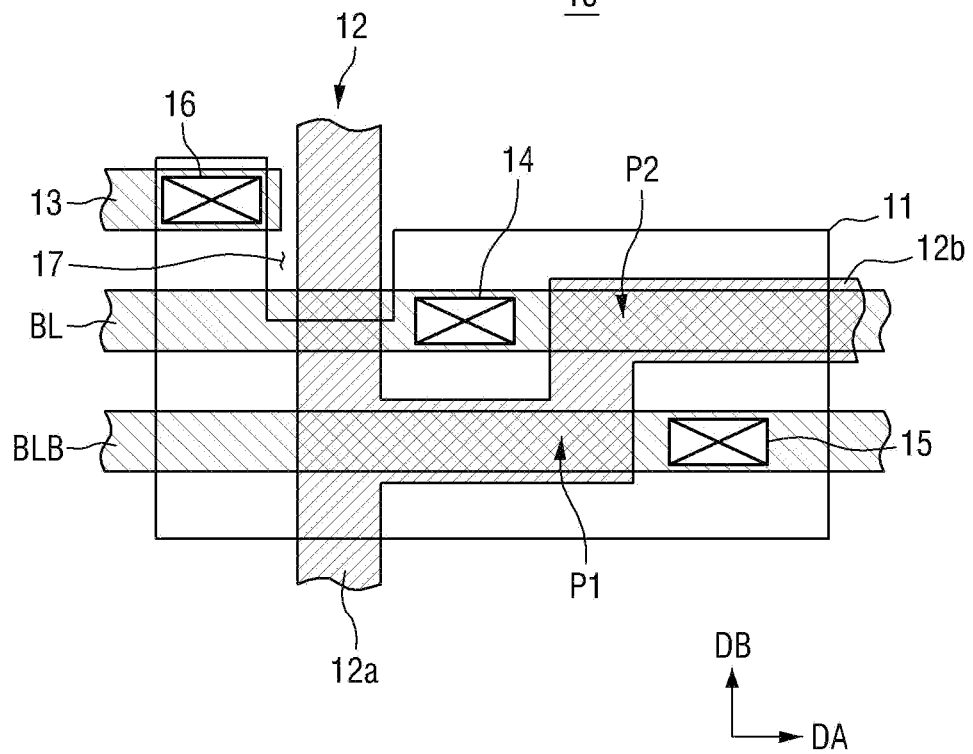
FIG. 2 is a layout diagram for describing the equalizing circuit of FIG. 1, according to an exemplary embodiment.

Referring to FIG. 1, an equalizing circuit 10 according to an exemplary embodiment includes an equalizing transistor TEQ and a plurality of pre-charged transistors TPC1 and TPC2. For example, the equalizing transistor TEQ and the plurality of pre-charged transistors TPC1 and TPC2 may be an N-type transistor.

The equalizing transistor TEQ is configured to be connected between a bit line BL and a complementary bit line BLB. A source and a drain of the equalizing transistor TEQ may be electrically connected with the bit line BL and the complementary bit line BLB, respectively. Alternatively, the source and the drain of the equalizing transistor TEQ may be electrically connected with the complementary bit line BLB and the bit line BL, respectively, according to an exemplary embodiment. An equalizing signal EQL is input to a gate of the equalizing transistor TEQ. The equalizing transistor TEQ may adjust voltages of the bit line BL and the complementary bit line BLB to the same voltage level according to the equalizing signal EQL. That is, the equalizing transistor TEQ may equalize a voltage of the bit line BL to a voltage of the complementary bit line BLB.

The plurality of pre-charged transistors TPC1 and TPC2 are configured to be connected between the bit line BL and the complementary bit line BLB. The plurality of pre-charged transistors TPC1 and TPC2 may include the first pre-charged transistor TPC1 and the second pre-charged transistor TPC2 which are serially connected with each other. A source of the first pre-charged transistor TPC1 and a source of the second pre-charged transistor TPC2 are electrically connected with the bit line BL and the complementary bit line BLB, respectively. A pre-charged voltage VBL is input to a drain of the first pre-charged transistor TPC1 and a drain of the second pre-charged transistor TPC2. An equalizing signal is input to a gate of the first pre-charged transistor TPC1 and a gate of the second pre-charged transistor TPC2. The plurality of pre-charged transistors TPC1 and TPC2 may supply the pre-charged voltage VBL to the bit line BL and the complementary bit line BLB according to the equalizing signal. That is, the plurality of pre-charged transistors TPC1 and TPC2 may pre-charge the bit line BL and the complementary bit line BLB.

An operation of the equalizing circuit 10 according to an exemplary embodiment will be described below. First, when the equalizing signal EQL has a first level (for example, a high level), the equalizing transistor TEQ and the plurality of pre-charged transistors TPC1 and TPC2 are turned on. Accordingly, the bit line BL and the complementary bit line BLB are equalized to have the pre-charged voltage VBL. Then, when the equalizing signal EQL has a second level (for example, a low level), the equalizing transistor TEQ and the plurality of pre-charged transistors TPC1 and TPC2 are turned off. Accordingly, the bit line BL and the complementary bit line BLB are in a floating condition maintaining the pre-charged voltage VBL.

FIG. 2 is a layout diagram for describing an equalizing circuit according to an exemplary embodiment. The equalizing circuit of FIG. 2 may the same as the equalizing circuit of FIG. 1.

As illustrated in FIG. 2, an active region 11, the bit line BL, the complementary bit line BLB, and a gate pattern 12 may be formed in the equalizing circuit 10 according to the present embodiment.

The pre-charged voltage VBL may be provided to the active region 11.

The bit line BL and the complementary bit line BLB may traverse the active region 11. Particularly, the bit line BL and the complementary bit line BLB may be disposed on the active region 11 in a first direction (for example, DA in FIG. 2).

The gate pattern 12 may be disposed on the active region 11. The gate pattern 12 may include a first pattern 12a and a second pattern 12b. The first pattern 12a may be disposed in a second direction (for example, DB in FIG. 2). The second pattern 12b may be extended from one side of the first pattern 12a to be disposed in the first direction. The second pattern 12b may be formed in a stair shape. That is, the second pattern 12b may be extended from one side of the first pattern 12a in the first direction, bent at a first position P1 in the second direction and extended, and then bent at a second position P2 in the first direction again and extended. As described below, the equalizing transistor TEQ and the plurality of pre-charged transistors TPC1 and TPC2 may share the gate pattern 12, as shown in FIG. 1. The equalizing signal EQL of FIG. 1 may be input to the gate pattern 12.

The first direction may cross the second direction. The first direction may be vertical with respect to the second direction.

The active region 11 and the bit line BL may be connected by a first contact 14, and the active region 11 and the complementary bit line BLB may be connected by a second contact 15. The first contact 14 may be disposed at one side (for example, a right side in FIG. 2) of the first pattern 12a of the gate pattern 12 and at one side (for example, an upper side in FIG. 2) of the second pattern 12b of the gate pattern 12. The second contact 15 may be disposed at the one side of the first pattern 12a of the gate pattern 12 and at the other side (for example, a lower side in FIG. 2) of the second pattern 12b of the gate pattern 12. Particularly, the first contact 14 and the second contact 15 may be disposed at a plurality of corners of the second pattern 12b of the gate pattern 12, respectively. The first contact 14 may be disposed to be adjacent to a corner at which the second pattern 12b of the gate pattern 12 is bent in the second direction, and the second contact 15 may be disposed to be adjacent to a corner at which the second pattern 12b of the gate pattern 12 is bent in the first direction.

A metal pattern 13, to which the pre-charged voltage VBL is input, may be further formed in the equalizing circuit 10. A third contact 16 may connect the active region 11 and the metal pattern 13 to provide the pre-charged voltage VBL to the active region 11. The third contact 16 may be disposed at the other side (for example, a left side in FIG. 2) of the first pattern 12a of the gate pattern 12.

The first contact 14, the second contact 15, and the third contact 16 may be direct contacts (DC) directly connecting a metal layer and a semiconductor layer.

The gate pattern 12, the first contact 14, and the second contact 15 may constitute the equalizing transistor TEQ described above with reference to FIG. 1. The first contact 14 and the second contact 15 may serve as a source contact and a drain contact of the equalizing transistor TEQ, respectively.

The gate pattern 12, the first contact 14, and the third contact 16 may constitute the first pre-charged transistor TPC1 described with reference to FIG. 1. The gate pattern 12, the second contact 15, and the third contact 16 may constitute the second pre-charged transistor TPC2 described above with reference to FIG. 1. The first pre-charged transistor TPC1 and the second pre-charged transistor TPC2 may share the third contact 16 as the drain contact. The first pre-charged transistor TPC1 and the second pre-charged transistor TPC2 may share the first contact 14 and the second contact 15, which are the source contact and the drain contact 15 of the equalizing transistor EQ, respectively, as their source contacts, respectively. In other words, the first contact 14 may serve as the source contact of the first pre-charged transistor TPC1, and the second contact 15 may serve as the source contact of the second pre-charged transistor TPC2.

An active cut 17 may be formed between the first contact 14 and the third contact 16 in the equalizing circuit 10. The formation of the active cut 17 between the first contact 14 and the third contact 16 represents that a non-active region may be present at a partial space between the first contact 14 and the third contact 16. According to the formation of the active cut between the first contact 14 and the third contact 16, the equalizing circuit 10 may have symmetry between the first pre-charged transistor TPC1 and the second pre-charged transistor TPC2 (particularly, symmetry in terms of a width).

In the layout of the equalizing circuit 10 described above with reference to FIG. 2, the gate pattern 12 is bent in the stair shape, so that it is possible to design the equalizing circuit including one equalizing transistor TEQ and the plurality of pre-charged transistors TPC1 and TPC2 even within a small occupying area. Further, the equalizing circuit 10 includes the plurality of pre-charged transistors TPC1 and TPC2, so that a row pre-charge time (tRP) characteristic of a memory device including the equalizing circuit 10 may be improved.

Figure 3:
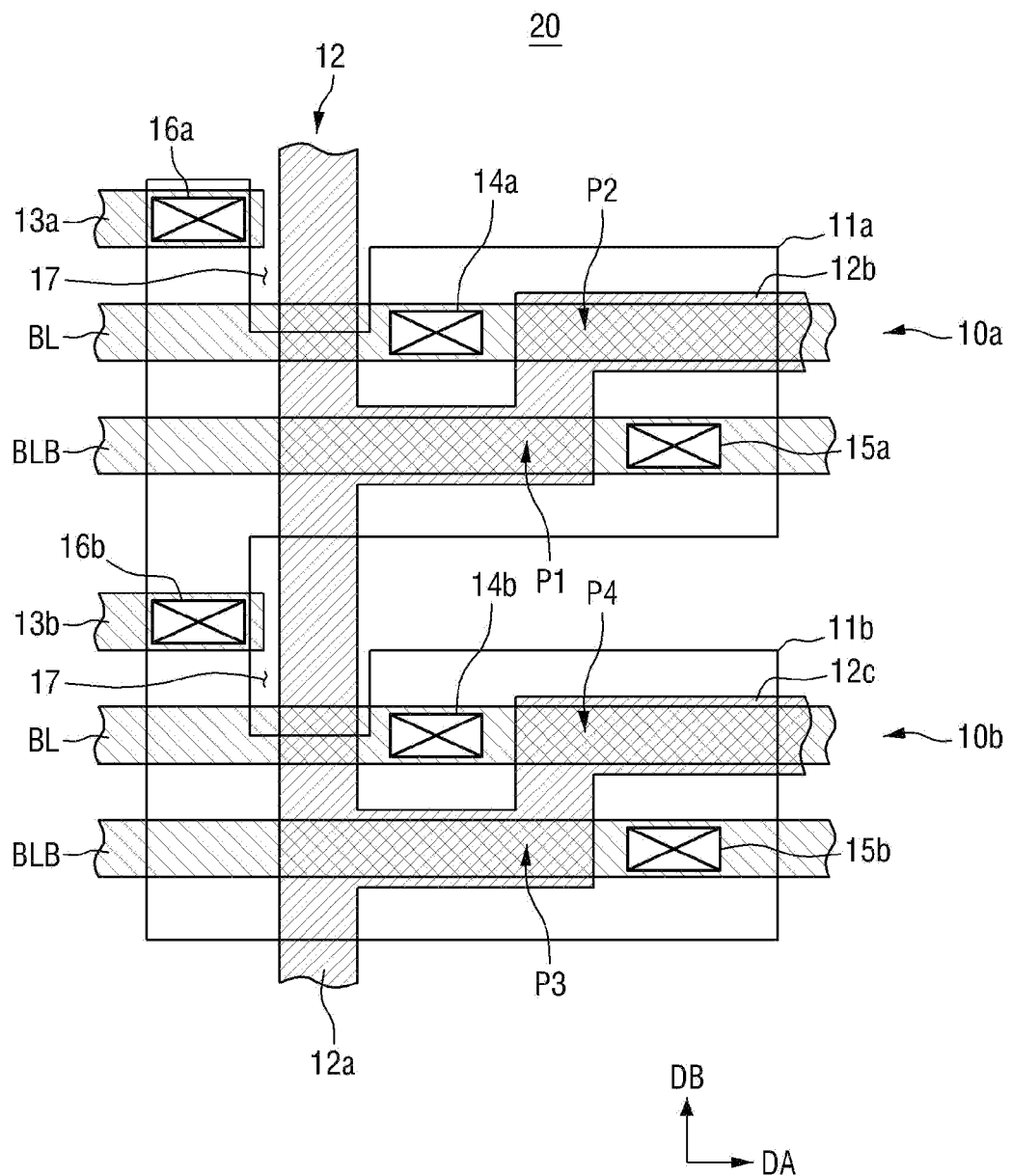
FIG. 3 is a layout diagram for describing an equalizing circuit array according to an exemplary embodiment.

FIG. 3 is a layout diagram for describing an equalizing circuit array according to an exemplary embodiment.

Referring to FIG. 3, an equalizing circuit array 20 according to the embodiment includes a first equalizing circuit 10a and a second equalizing circuit 10b.

Each of the first equalizing circuit 10a and the second equalizing circuit 10b may be substantially identically configured to the equalizing circuit 10 described above with reference to FIGS. 1 and 2. The first equalizing circuit 10a and the second equalizing circuit 10b may be disposed in parallel in a vertical direction in FIG. 3.

A first active region 11a is formed in the first equalizing circuit 10a, and a second active region 11b is formed in the second equalizing circuit 10b. The first active region 11a and the second active region 11b may be spaced apart from each other in a region at one side (for example, a right side in FIG. 3) of the gate pattern 12, and the first active region 11a and the second active region 11b may be connected with each other in a region at the other side (for example, a left side in FIG. 3) of the gate pattern 12.

The gate pattern 12 may be disposed on the active regions 11a and 11b. The gate pattern 12 may include a first pattern 12a, a second pattern 12b, and a third pattern 12c. The second pattern 12b may be extended from one side of the first pattern 12a on the first active region 11a to be disposed in a first direction. The third pattern 12c may be extended from the one side of the first pattern 12a on the second active region 11b to be disposed in the first direction. The second pattern 12b and the third pattern 12c may be formed in a stair shape. That is, the second pattern 12b may be extended from one side of the first pattern 12a in the first direction, bent at a first position P1 in the second direction and extended, and then bent at a second position P2 in the first direction again and extended. The third pattern 12c may be extended from the one side of the first pattern 12a in the first direction, bent at a third position P3 in a second direction and extended, and then bent at a fourth position P4 in the first direction again and extended.

An equalizing transistor TEQ and a plurality of pre-charged transistors TPC1 and TPC2 of the first equalizing circuit 10a, and an equalizing transistor TEQ and a plurality of pre-charged transistors TPC1 and TPC2 of the second equalizing circuit 10b may share the gate pattern 12.

Figure 4:
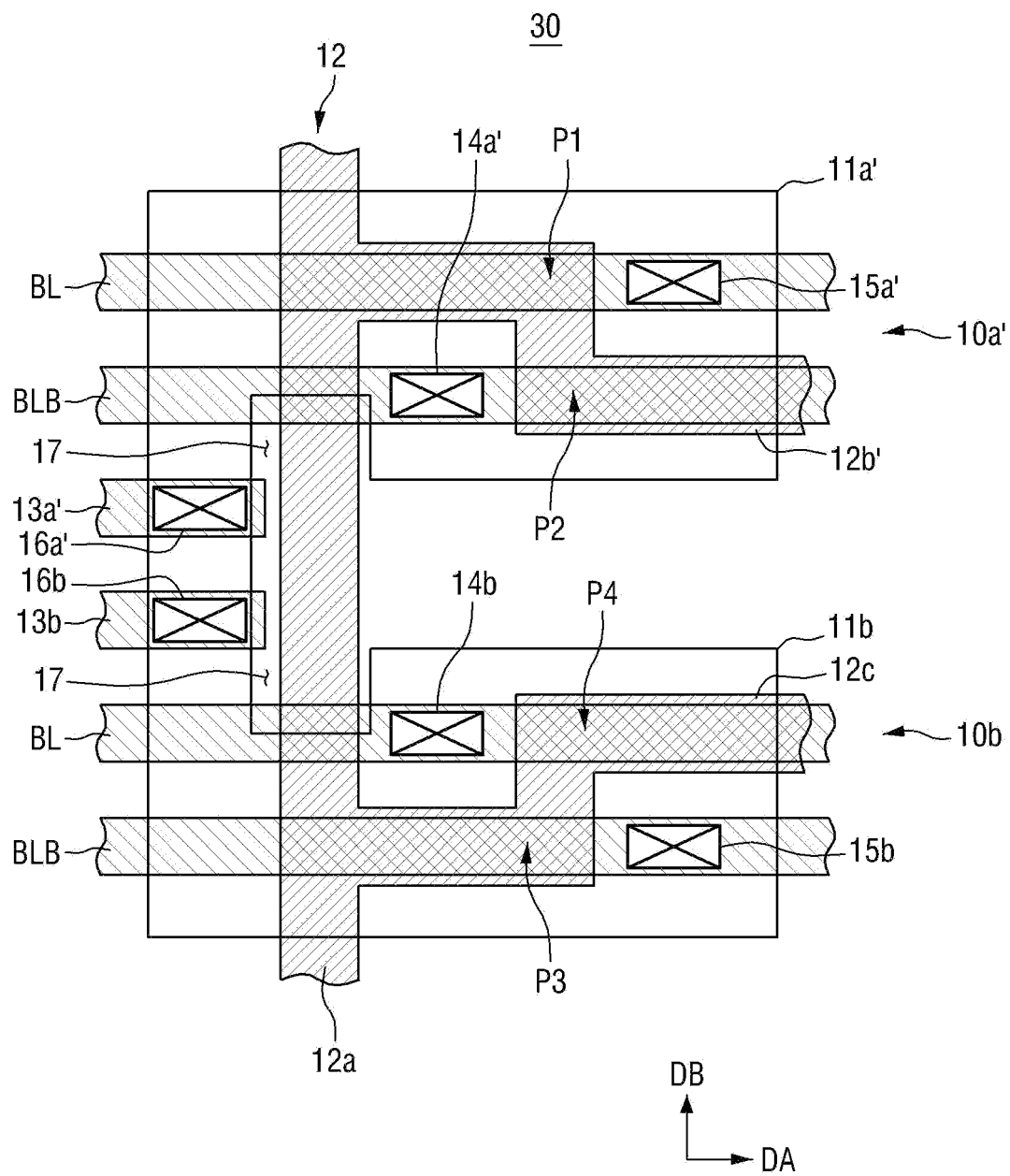
FIG. 4 is a layout diagram for describing an equalizing circuit array according to another exemplary embodiment.

FIG. 4 is a layout diagram for describing an equalizing circuit array according to another exemplary embodiment.

Referring to FIG. 4, an equalizing circuit array 30 according to the embodiment includes a first equalizing circuit 10a' and a second equalizing circuit 10b.

Each of the first equalizing circuit 10a' and the second equalizing circuit 10b may be substantially identically configured to the equalizing circuit 10 described above with reference to FIGS. 1 and 2. The first equalizing circuit 10a' may be disposed to be symmetrical to the second equalizing circuit 10b in a vertical direction in FIG. 4. In FIG. 4, a symbol "'" in the reference numeral may represent an upside-down disposition of an individual constituent element, compared to the equalizing circuit 10 of FIG. 1.

A gate pattern 12 may be disposed on active regions 11a' and 11b. The gate pattern 12 may include a first pattern 12a, a second pattern 12b', and a third pattern 12c. The second pattern 12b' may be extended from one side of the first pattern 12a on the first active region 11a' to be disposed in a first direction. The third pattern 12c may be extended from the one side of the first pattern 12a on the second active region 11b to be disposed in the first direction. The second pattern 12b' and the third pattern 12c may be formed in a stair shape. That is, the second pattern 12b' may be extended from one side of the first pattern 12a in the first direction, bent at a first position P1 in a reverse direction of a second direction and extended, and then bent at a second position P2 in the first direction again and extended. The third pattern 12c may be extended from the one side of the first pattern 12a in the first direction, bent at a third position P3 in the second direction and extended, and then bent at a fourth position P4 in the first direction again and extended.

An equalizing transistor TEQ and a plurality of pre-charged transistors TPC1 and TPC2 of the first equalizing circuit 10a', and an equalizing transistor TEQ and a plurality of pre-charged transistors TPC1 and TPC2 of the second equalizing circuit 10b may share the gate pattern 12.

Figure 5:
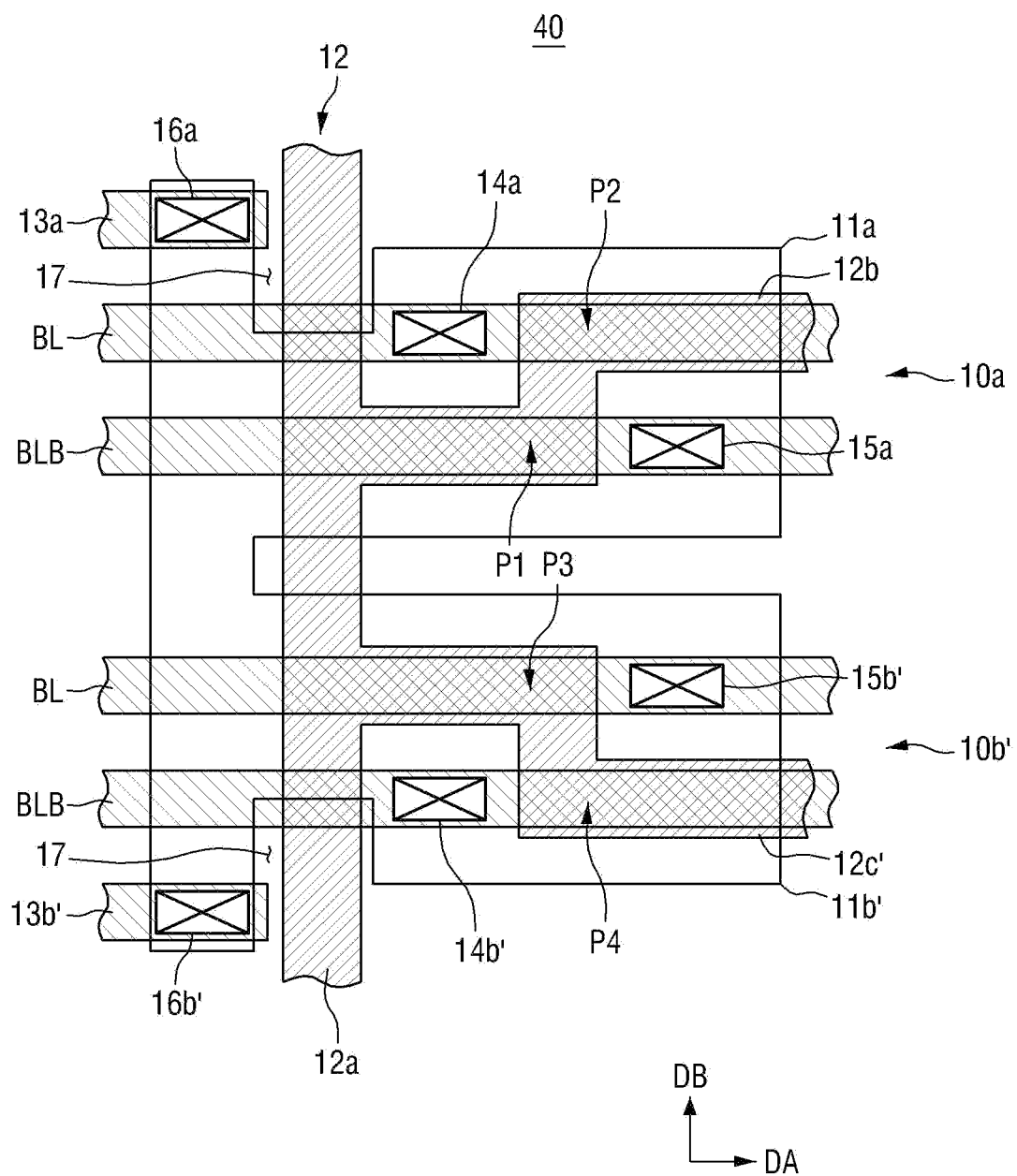
FIG. 5 is a layout diagram for describing an equalizing circuit array according to yet another exemplary embodiment.

FIG. 5 is a layout diagram for describing an equalizing circuit array according to yet another exemplary embodiment.

Referring to FIG. 5, an equalizing circuit array 40 according to the embodiment includes a first equalizing circuit 10a and a second equalizing circuit 10b'.

Each of the first equalizing circuit 10a and the second equalizing circuit 10b' may be substantially identically configured to the equalizing circuit 10 described above with reference to FIGS. 1 and 2. The second equalizing circuit 10b' may be disposed to be symmetrical to the first equalizing circuit 10 in a vertical direction in FIG. 5. In FIG. 5, a symbol "'" in the reference numeral may represent an upside-down disposition of an individual constituent element, compared to the equalizing circuit 10 of FIG. 1.

A gate pattern 12 may be disposed on active regions 11a and 11b'. The gate pattern 12 may include a first pattern 12a, a second pattern 12b, and a third pattern 12c'. The second pattern 12b may be extended from one side of the first pattern 12a on the first active region 11a to be disposed in a first direction. The third pattern 12c' may be extended from the one side of the first pattern 12a on the second active region 11b' to be disposed in the first direction. The second pattern 12b and the third pattern 12c' may be formed in a stair shape. That is, the second pattern 12b may be extended from one side of the first pattern 12a in the first direction, bent at a first position P1 in a second direction and extended, and then bent at a second position P2 in the first direction again and extended. The third pattern 12c' may be extended from the one side of the first pattern 12a in the first direction, bent at a third position P3 in a reverse direction of the second direction and extended, and then bent at a fourth position P4 in the first direction again and extended.

An equalizing transistor TEQ and a plurality of pre-charged transistors TPC1 and TPC2 of the first equalizing circuit 10a', and an equalizing transistor TEQ and a plurality of pre-charged transistors TPC1 and TPC2 of the second equalizing circuit 10b' may share the gate pattern 12.

Figure 6:
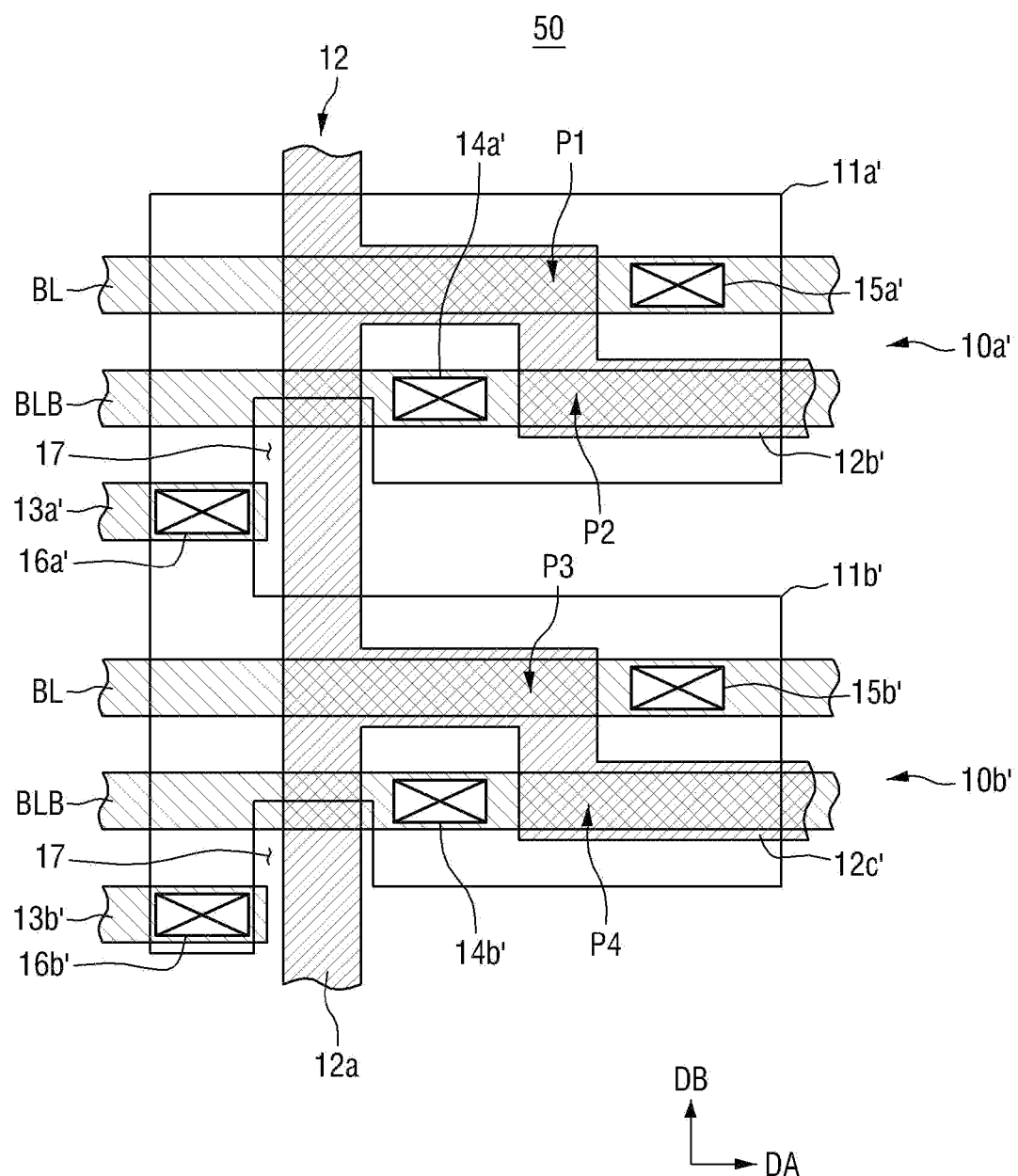
FIG. 6 is a layout diagram for describing an equalizing circuit array according to still another exemplary embodiment.

FIG. 6 is a layout diagram for describing an equalizing circuit array according to still another exemplary embodiment.

Referring to FIG. 6, an equalizing circuit array 50 according to the embodiment includes a first equalizing circuit 10a' and a second equalizing circuit 10b'.

Each of the first equalizing circuit 10a' and the second equalizing circuit 10b' may be substantially identically configured to the equalizing circuit 10 described above with reference to FIGS. 1 and 2.

The first equalizing circuit 10a' and the second equalizing circuit 10b' may be disposed in parallel in a vertical direction in FIG. 6.

In FIG. 6, a symbol "'" in the reference numeral may represent an upside-down disposition of an individual constituent element, compared to the equalizing circuit 10 of FIG. 1.

A gate pattern 12 may be disposed on active regions 11a' and 11b'. The gate pattern 12 may include a first pattern 12a, a second pattern 12b', and a third pattern 12c'. The second pattern 12b' may be extended from one side of the first pattern 12a on the first active region 11a' to be disposed in a first direction. The third pattern 12c' may be extended from the one side of the first pattern 12a on the second active region 11b' to be disposed in the first direction. The second pattern 12b' and the third pattern 12c' may be formed in a stair shape. That is, the second pattern 12b' may be extended from one side of the first pattern 12a in the first direction, bent at a first position P1 in a reverse direction of a second direction and extended, and then bent at a second position P2 in the first direction again and extended. The third pattern 12c' may be extended from the one side of the first pattern 12a in the first direction, bent at a third position P3 in a reverse direction of the second direction and extended, and then bent at a fourth position P4 in the first direction again and extended.

An equalizing transistor TEQ and a plurality of pre-charged transistors TPC1 and TPC2 of the first equalizing circuit 10a', and an equalizing transistor TEQ and a plurality of pre-charged transistors TPC1 and TPC2 of the second equalizing circuit 10b' may share the gate pattern 12.

Figure 7:
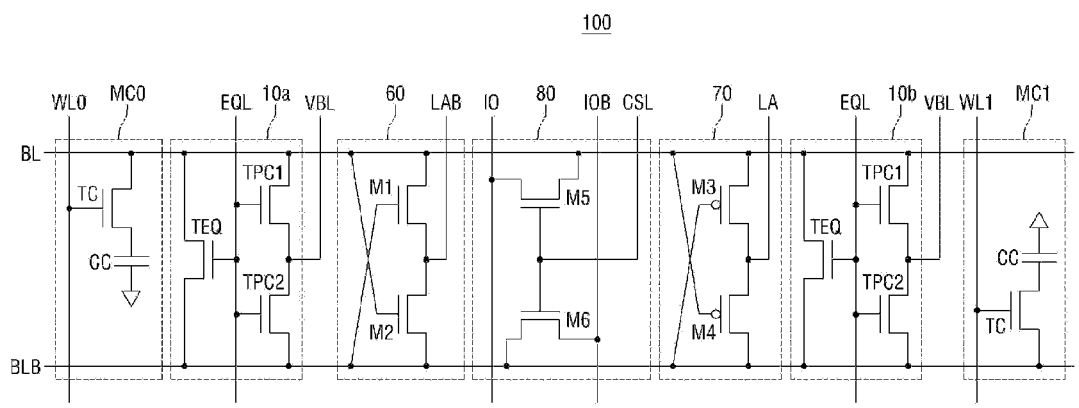
FIG. 7 is a circuit diagram for describing a sense amplifier circuit including the equalizing circuit array of FIGS. 3 to 6, according to an exemplary embodiment.

FIG. 7 is a circuit diagram for describing a sense amplifier circuit including the equalizing circuit array of FIGS. 3 to 6, according to an exemplary embodiment.

Referring to FIG. 7, a sense amplifier circuit 100 includes equalizing circuit arrays 10a and 10b and a sensing circuit. The sensing circuit includes a first amplifier 60, a second amplifier 70, and an input/output gating unit 80.

The first amplifier 60 may include a first transistor M1 and a second transistor M2. The first transistor M1 and the second transistor M2 may be serially connected between a bit line BL and a complementary bit line BLB. For example, the first transistor M1 and the second transistor M2 may be N-type transistors.

A source of the first transistor M1 and a source of the second transistor M2 are electrically connected with the bit line BL and the complementary bit line BLB, respectively. A first amplification voltage LAB is input to a drain of the first transistor M1 and a drain of the second transistor M2. For example, a ground voltage Vss may be used as the first amplification voltage LAB. A gate of the first transistor M1 and a gate of the second transistor M2 are electrically connected with the complementary bit line BLB and the bit line BL, respectively. The first amplifier 60 may provide the first amplification voltage LAB to the bit line BL or the complementary bit line BLB according to a change in the voltage of the bit line BL or the complementary bit line BLB.

The second amplifier 70 may include a third transistor M3 and a fourth transistor M4. The third transistor M3 and the fourth transistor M4 may be serially connected between the bit line BL and the complementary bit line BLB. For example, the third transistor M3 and the fourth transistor M4 may be P-type transistors.

A source of the third transistor M3 and a source of the fourth transistor M4 are electrically connected with the bit line BL and the complementary bit line BLB, respectively. A second amplification voltage LA is input to a drain of the third transistor M3 and a drain of the fourth transistor M4. For example, a power voltage Vpp may be used as the second amplification voltage LA. A gate of the third transistor M3 and a gate of the fourth transistor M4 are electrically connected with the complementary bit line BLB and the bit line BL, respectively. The second amplifier 70 may provide the second amplification voltage LA to the bit line BL or the complementary bit line BLB according to a change in the voltage of the bit line BL or the complementary bit line BLB.

The input/output gating unit 80 may include a fifth transistor M5 and a sixth transistor M6. A drain of the fifth transistor M5 and a drain of the sixth transistor M6 are electrically connected with the bit line BL and the complementary bit line BLB, respectively. A source of the fifth transistor M5 is electrically connected with an input/output line 10, and a source of the sixth transistor M6 is electrically connected with a complementary input/output line IOB. A column selection signal CSL is input to a gate of the fifth transistor M5 and a gate of the sixth transistor M6.

An operation of the sense amplification circuit 100 will be described below. First, when a word line WL is activated, a switching transistor TC of a memory cell MC is turned on, so that charges move between the bit line BL or the complementary bit line BLB and a cell capacitor CC. Then, the first amplifier 60 or the second amplifier 70 amplifies a potential difference between the bit line BL and the complementary bit line BLB. Then, when the column selection signal CSL has a first level, the input/output gating unit 80 outputs data of the bit line BL or the complementary bit line BLB through the input/output line IO or the complementary input/output line IOB. The equalizing circuit arrays 10a and 10b equalize the voltages of the bit line BL and the complementary bit line BLB to the pre-charged voltage VBL before and after the operation of the sensing circuit.

In the circuit diagram of FIG. 7, the reference numerals of the equalizing circuit array of FIG. 3 are illustrated, but the equalizing circuit arrays of FIGS. 4 to 6 may also be substantially identically applied to the circuit diagram of FIG. 7.

Figure 8:
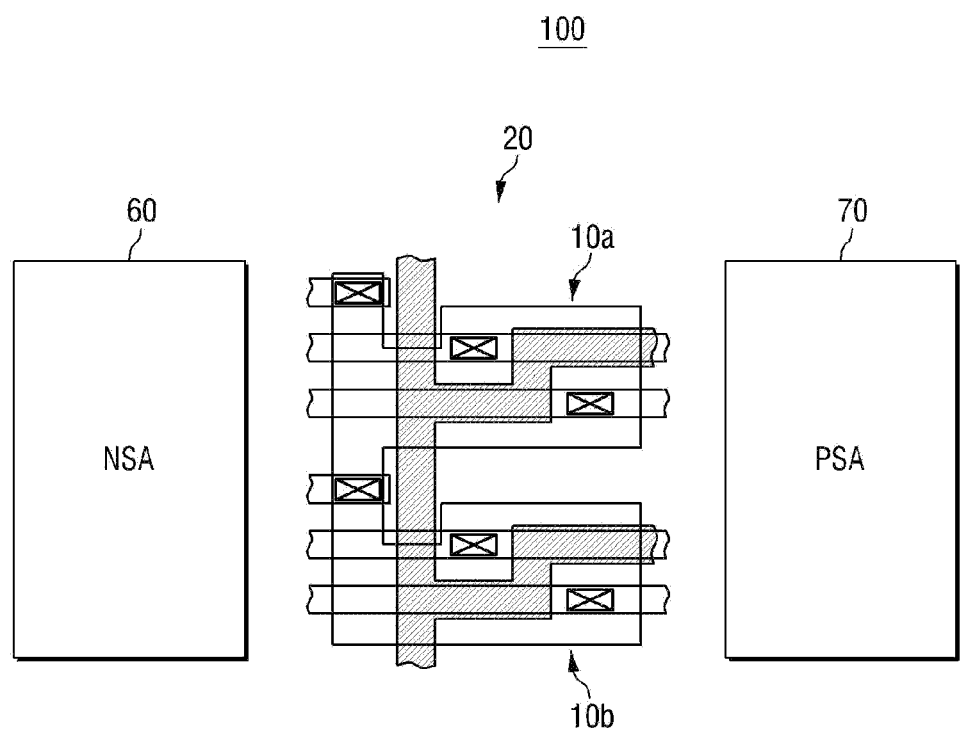
FIG. 8 is a concept diagram for describing a disposition of the sense amplifier circuit including the equalizing circuit array of FIGS. 3 to 6, according to an exemplary embodiment.
Figure 9:
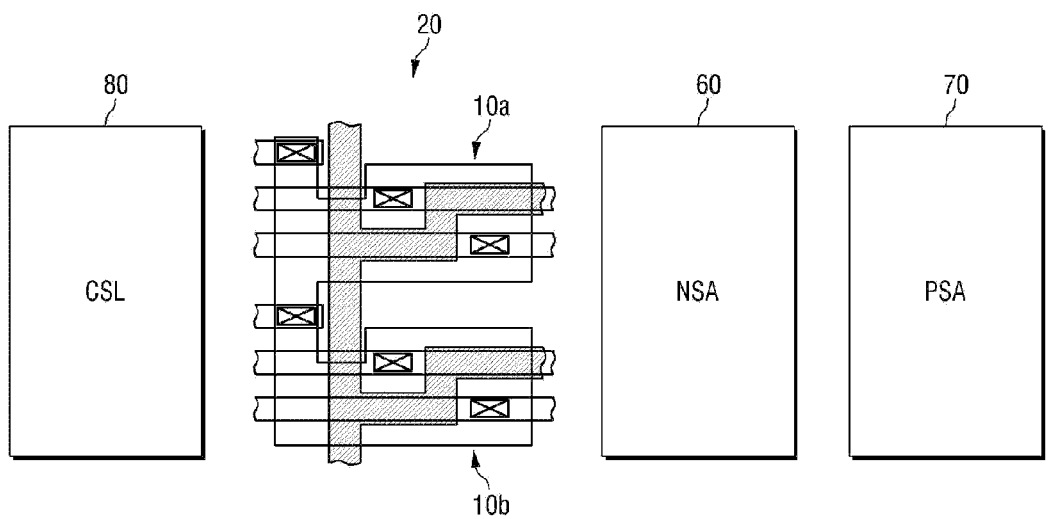
FIG. 9 is a concept diagram for describing an application example of a disposition of the sense amplifier circuit including the equalizing circuit array of FIGS. 3 to 6, according to an exemplary embodiment.

FIG. 8 is a concept diagram for describing a disposition of the sense amplifier circuit including the equalizing circuit array of FIGS. 3 to 6, according to an exemplary embodiment, and FIG. 9 is a concept diagram for describing an application example of a disposition of the sense amplifier circuit including the equalizing circuit array of FIGS. 3 to 6, according to an exemplary embodiment.

Referring to FIG. 8, the first amplifier 60 described above with reference to FIG. 7 may be disposed at one side (for example, a left side in FIG. 8) of the equalizing circuit array 20, and the second amplifier 70 described with reference to FIG. 7 may be disposed at the other side (for example, a right side in FIG. 8) of the equalizing circuit array 20.

Referring to FIG. 9, the input/output gating unit 80 described above with reference to FIG. 7 may be disposed at one side (for example, a left side in FIG. 9) of the equalizing circuit array 20, and the first amplifier 60 and the second amplifier 70 described with reference to FIG. 7 may be disposed at the other side (for example, a right side in FIG. 9) of the equalizing circuit array 20. The first amplifier 60 may be disposed between the equalizing circuit array 20 and the second amplifier 70.

In FIGS. 8 and 9, the reference numerals of the equalizing circuit array of FIG. 3 are illustrated, but the equalizing circuit arrays of FIGS. 4 to 6 may also be substantially identically applied to the circuit diagrams of FIGS. 8 and 9.

Figure 10:
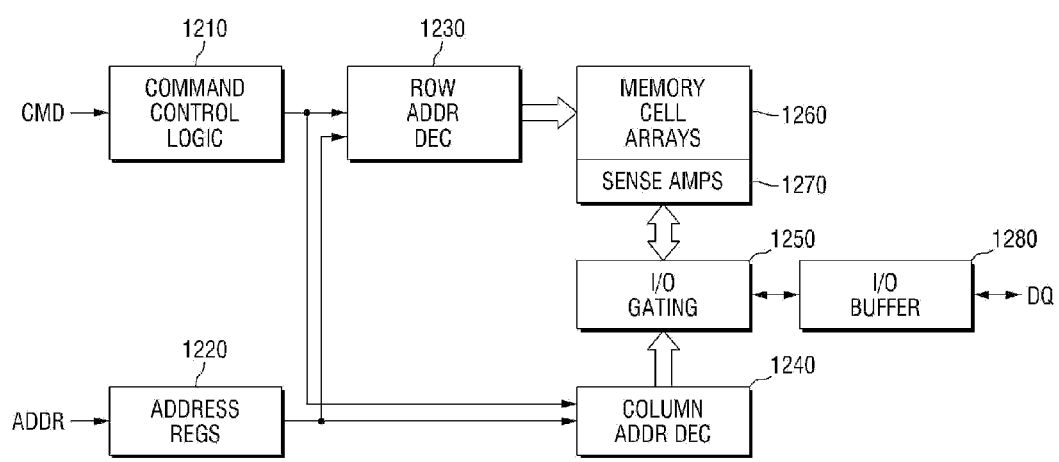
FIG. 10 is a block diagram for describing a memory device including the sense amplifier circuit of FIG. 7, according to an exemplary embodiment.

FIG. 10 is a block diagram for describing a memory device including the sense amplifier circuit of FIG. 7, according to an exemplary embodiment.

Referring to FIG. 10, a memory device 1200 includes a command control logic (COMMAND CONTROL LOGIC) 1210, an address register (ADDRESS REGS) 1220, a row address decoder (ROW ADDR DEC) 1230, a column address decoder (COLUMN ADDR DEC) 1240, an input/output gating circuit (I/O GATING) 1250, a memory cell array (MEMORY CELL ARRAYS) 1260, a sense amplifier (SENSE AMPS) 1270, and an input/output buffer (I/O BUFFER) 1280.

The command control logic 1210 may control an operation of the memory device 1200 by receiving a command CMD from the outside (for example, a memory controller). For example, the command control logic 1210 may generate control signals by decoding the command CMD including a write enable signal /WE, a row address strobe signal /RAS, a column address strobe signal /CAS, a chip selection signal /CS and the like. The command control logic 1210 may provide the control signals to the row address decoder 1230 and the column address decoder 1240 so that the memory device 200 performs a write, read, or erase operation.

The address register 1220 may receive an address ADDR from the outside. For example, the address register 1220 may receive the address ADDR including a row address signal ROW_ADDR and a column address signal COL_ADDR. Further, the address register 1220 may also receive a bank address signal BANK_ADDR. The address register 1220 provides the received row address signal ROW_ADDR to the row address decoder 1230, and may provide the received column address signal COL_ADDR to the column address decoder 1240.

The row address decoder 1230 may activate a word line of the memory cell array 1260 corresponding to the row address signal ROW_ADDR. The column address decoder 1240 may activate the sense amplifier 1270 corresponding to the column address signal COL_ADDR through the input/output gating circuit 1250.

The memory cell array 1260 may include a plurality of memory cells for storing data. The memory cell array 1260 includes a plurality of word lines and a plurality of bit lines, and each memory cell may be connected to one word line and one bit line. The plurality of memory cells may constitute one or more memory blocks. Further, the plurality of memory blocks may constitute one or more memory banks.

The sense amplifier 1270 may detect data of a selected memory cell in the memory cell array 1260 and amplify the detected data. The sense amplifier 1270 may include one or more sense amplifier circuits 100 described above with reference to FIG. 7.

The input/output gating circuit 1250 may include write drivers for writing data in the memory cell array 1260, and read latches for storing the data read from the memory cell array 1260, together with circuits gating input/output data.

The input/output buffer 1280 may receive data DQ to be written in the memory cell array 1260 from a memory controller 1100. The memory controller 1100 will be described later with reference to FIG. 11. The input/output buffer 1280 may provide the data DQ to be written in the memory cell array 1260 to the memory cell array 1260 through the writing drivers. The data DQ read from the memory cell array 1260 may be detected by the sense amplifier 1270, and stored in the read latches. The input/output buffer 1280 may provide the data DQ stored in the read latches to the memory controller 1100.

Although it is not clearly illustrated, the memory device 1200 may further include non-illustrated other constituent elements.

Figure 11:
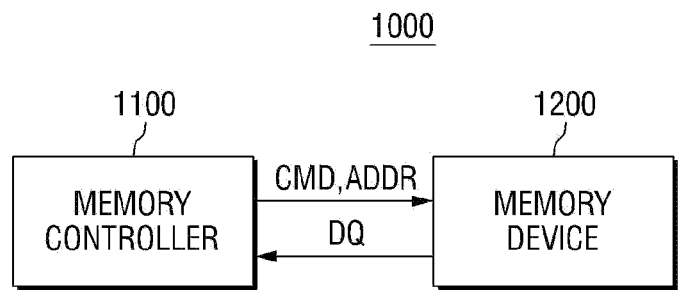
FIG. 11 is a block diagram for describing a memory system including the memory device of FIG. 10, according to an exemplary embodiment.

FIG. 11 is a block diagram for describing a memory system including the memory device of FIG. 10, according to an exemplary embodiment.

Referring to FIG. 11, a memory system 1000 includes the memory controller 1100 and the memory device 1200.

The memory controller 1100 is configured to control the memory device 1200. The memory controller 1100 may access the memory device 1200 in response to a request of a host. For example, the memory controller 1100 may write data in the memory device 1200, or read data from the memory device 1200. To this end, the memory controller 1100 may provide the command CMD and the address ADDR to the memory device 1200, and exchange the data DQ with the memory device 1200. The memory controller 1100 is configured to drive a firmware for controlling the memory device 1200.

The memory device 1200 is configured to store data. For example, the memory device 1200 may be a DRAM, such as a double data rate static DRAM (DDR SDRAM), a single data rate SDRAM (SDR SDRAM), a low power DDR SDRAM (LPDDR SDRAM), a low power SDR SDRAM (LPSDR SDRAM), and a direct rambus DRAM (RDRAM), or a random volatile memory device.

Figure 12:
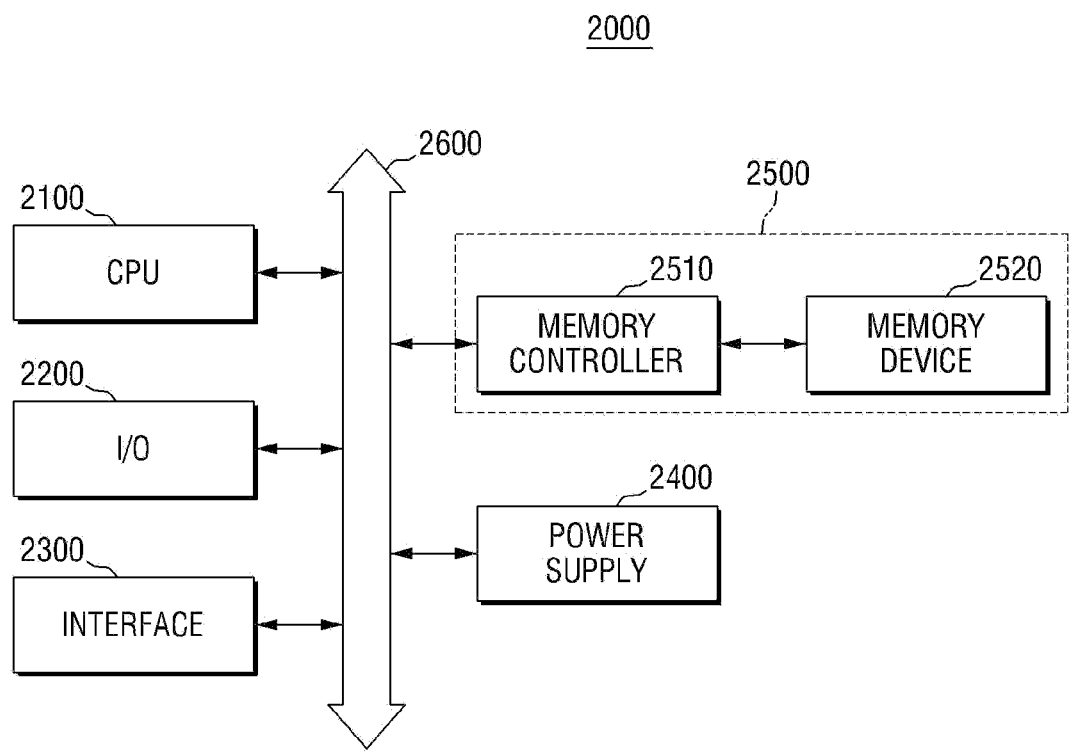
FIG. 12 is a block diagram for describing a computing system including the memory system of FIG. 11, according to an exemplary embodiment.

FIG. 12 is a block diagram for describing a computing system including the memory system of FIG. 11, according to an exemplary embodiment.

Referring to FIG. 12, a computing system 2000 includes a central processing unit (CPU) 2100, an input/output device (I/O) 2200, an interface device (INTERFACE) 2300, a power supply (POWER SUPPLY) 2400, and a memory system 2500. The central processing unit 2100, the input/output device 2200, the interface device 2300, the power supply 2400, and the memory system 2500 may be connected with each other through a bus 2600. The bus 2600 corresponds to a path through which data moves.

The central processing unit 2100 may include a single processor core (single core), or a plurality of processor cores (multi-core) to process data. For example, the central processing unit 2100 may include a multi-core, such as a dual-core, a quad-core, and a hexa-core. The central processing unit 2100 may further include various hardware devices (for example, an IP core) therein. The central processing unit 2100 may also include a cache memory located inside or outside.

The input/output device 2200 may include one or more input devices, such as a keypad and a touch screen, and/or one or more output devices, such as a speaker and a display device.

The interface device 2300 may perform wireless communication or wire communication with an external device. For example, the interface device 2300 may perform Ethernet communication, near field communication (NFC), radio frequency identification (RFID) communication, mobile telecommunication, memory card communication, universal serial bus (USB) communication, and the like.

The memory system 2500 may store data processed by the central processing unit 2100 or may be driven as a working memory of the central processing unit 2100. The memory system 2500 may include a memory controller 2510 and a memory device 2520. The memory controller 2510 and the memory device 2520 may be substantially identically configured to the memory controller 1100 and the memory device 1200 described with reference to FIG. 11, respectively.

The power supply 2400 may convert power input from the outside and provide the converted power to the respective constituent elements 2100 to 2500.

Although it is not clearly illustrated, the computing system 2000 may further include a nonvolatile memory device. For example, the nonvolatile memory device may be various nonvolatile memory devices, such as a read only memory (ROM), a programmable ROM (PROM), an electrically programmable ROM (EPROM), an electrically erasable programmable ROM (EEPROM), a flash memory, a phase-change RAM (PRAM), a resistive RAM (RRAM), and a ferroelectric RAM (FRAM).

According to an exemplary embodiment, the computing system 2000 may be a random computing system, such as a mobile phone, a smart phone, a personal digital assistant (PDA), a portable multimedia player (PMP), a digital camera, a music player, a portable game console, and a navigation system.

In concluding the detailed description, those skilled in the art will appreciate that many variations and modifications can be made to the above embodiments without substantially departing from the principles of the inventive concept. Therefore, the above embodiments of the inventive concept are used in a generic and descriptive sense only and not for purposes of limitation.

What is claimed is:

1. A bit line equalizing circuit comprising:
    an active region;
    a first bit line disposed on the active region in a first direction;
    a second bit line disposed on the active region in the first direction;
    a gate pattern including a first pattern disposed on the active region in a second direction crossing the first direction, and a second pattern extended from one side of the first pattern to be disposed in the first direction, the second pattern being formed in a stair shape on the active region;
    a first contact disposed at one side of the first pattern and one side of the second pattern, and configured to connect the active region and the first bit line;
    a second contact disposed at one side of the first pattern and the other side of the second pattern, and configured to connect the active region and the second bit line; and
    a third contact disposed at the other side of the first pattern, and configured to provide a predetermined voltage to the active region.

2. The bit line equalizing circuit of claim 1, wherein the first contact and the second contact are disposed at a plurality of corners of the second pattern, respectively.

3. The bit line equalizing circuit of claim 1, wherein the gate pattern, the first contact, and the second contact constitute a first transistor.

4. The bit line equalizing circuit of claim 3, wherein the first transistor equalizes a voltage of the first bit line and a voltage of the second bit line according to a signal input to the gate pattern.

5. The bit line equalizing circuit of claim 3, wherein the gate pattern, the first contact, and the third contact constitutes a second transistor, and
    wherein the gate pattern, the second contact, and the third contact constitute a third transistor.

6. The bit line equalizing circuit of claim 5, wherein the second transistor and the third transistor supply the predetermined voltage to the first bit line and the second bit line according to a signal input to the gate pattern, respectively.

7. The bit line equalizing circuit of claim 5, wherein an active cut is formed between the first contact and the third contact.

8. The bit line equalizing circuit of claim 5, further comprising a metal pattern to which the predetermined voltage is input,
wherein the third contact connects the active region and the metal pattern.

9. The bit line equalizing circuit of claim 1, wherein the first contact, the second contact, and the third contact are direct contacts.

10. The bit line equalizing circuit of claim 1, wherein the gate pattern, the first contact, and the third contact constitutes a first transistor, and
wherein the gate pattern, the second contact, and the third contact configure a second transistor.

11. The bit line equalizing circuit of claim 1, further comprising a metal pattern to which the predetermined voltage is input,
wherein the third contact connects the active region and the metal pattern.

12. The bit line equalizing circuit of claim 1, wherein the first direction is vertical to the second direction.

13. A bit line equalizing circuit comprising:
an active region traversed by a first bit line and a second bit line;
a plurality of transistors serially connected between the first bit line and the second bit line, and configured to supply a predetermined voltage to the first bit line and the second bit line; and
an equalizing transistor connected between the first bit line and the second bit line, and configured to equalize a voltage of the first bit line and a voltage of the second bit line,
wherein the plurality of transistors and the equalizing transistor share a gate pattern,
wherein the gate pattern includes a first pattern disposed on the active region in a first direction, and a second pattern extended from one side of the first pattern to be disposed in a second direction crossing the first direction, and
wherein the second pattern is bent at a first position in the first direction, and bent at a second position different from the first position in the second direction to be extended, the first position and the second position being included in the active region.

14. The bit line equalizing circuit of claim 13, wherein a source contact and a drain contact of the equalizing transistor are disposed at a corner at which the second pattern is bent in the first direction and a corner at which the second pattern is bent in the second direction, respectively.

15. The bit line equalizing circuit of claim 14, wherein the plurality of transistors includes a first transistor and a second transistor sharing a drain contact, and wherein the drain contact of the first transistor and the second transistor is disposed at the other side of the first pattern.

16. The bit line equalizing circuit of claim 15, wherein source contacts of the first transistor and the second transistor are connected to a source contact and a drain contact of the equalizing transistor, respectively.

17. The bit line equalizing circuit of claim 15, wherein the drain contact of the first transistor and the second transistor connects the active region and a metal pattern to which the predetermined voltage is input.

18. A bit line equalizing circuit comprising:
an equalizing transistor which is connected to a first bit line and a second bit line, and configured to be turned on if an equalizing signal is input; and
a plurality of transistors which are connected to one another, configured to be turned on and provide a predetermined voltage to the first and second bit lines, if the equalizing signal is input,
wherein the first and second bit lines are equalized to have a same voltage by the predetermined voltage,
wherein the plurality of transistors and the equalizing transistor share a gate pattern, and
wherein the gate pattern includes a first pattern disposed on an active region in a first direction, and a second pattern extended from one side of the first pattern to be disposed in a second direction crossing the first direction, the second pattern being formed in a stair shape on the active region.

19. The bit line equalizing circuit of claim 18, wherein the equalizing signal is input to gates of the equalizing transistor and the plurality of transistors, respectively, to turn on the equalizing transistor and the plurality of transistors.

20. The bit line equalizing circuit of claim 19, wherein the first bit line and the second bit line are connected to a source and a drain of the equalizing transistors, respectively, and
wherein the source of the equalizing transistor is connected to a source of one of the plurality of transistors, and the drain of the equalizing transistor is connected to a source of another of the plurality of transistors.

* * * * *